United States Patent [19]

Andrewartha

[11] Patent Number: 5,754,557

[45] Date of Patent: May 19, 1998

[54] METHOD FOR REFRESHING A MEMORY, CONTROLLED BY A MEMORY CONTROLLER IN A COMPUTER SYSTEM, IN A SELF-REFRESH MODE WHILE SCANNING THE MEMORY CONTROLLER

[75] Inventor: J. Michael Andrewartha, Plano, Tex.

[73] Assignee: Hewlett-Packard Co., Palo Alto, Calif.

[21] Appl. No.: 720,960

[22] Filed: Oct. 10, 1996

[51] Int. Cl.[6] .................................................. G01R 31/28
[52] U.S. Cl. .................. 371/21.1; 371/22.1; 395/183.06
[58] Field of Search ............................ 371/21.1, 22.1, 371/22.31, 25.1, 22.32, 22.5, 22.6; 324/73 R, 73 AT; 365/201, 222; 395/183.06

[56] References Cited

U.S. PATENT DOCUMENTS

| | | | |
|---|---|---|---|
| 4,827,476 | 5/1989 | Garcia | 371/25.1 |
| 5,109,382 | 4/1992 | Fukunaka | 371/21.1 |
| 5,625,597 | 4/1997 | Hirose | 365/201 |

Primary Examiner—Hoa T. Nguyen

[57] ABSTRACT

A method and system for preserving the state of memory while a memory subsystem is scan tested. In certain situations, it is desirable to scan test a memory subsystem. Scan testing is accomplished by causing the registers in a memory controller to form at least one ring. Then, register values are shifted through the ring and analyzed. Clocks within the memory controller must be stopped before scan testing can be conducted. Accordingly, the memory controller is unable to provide refresh requests to the memory during testing. Therefore, the memory controller places the memory in a self-refresh mode during scanning. While in the self-refresh mode, the memory automatically refreshes itself but does not respond to read or write requests. Once scanning is completed, the memory controller takes the memory out of self-refresh mode.

20 Claims, 2 Drawing Sheets

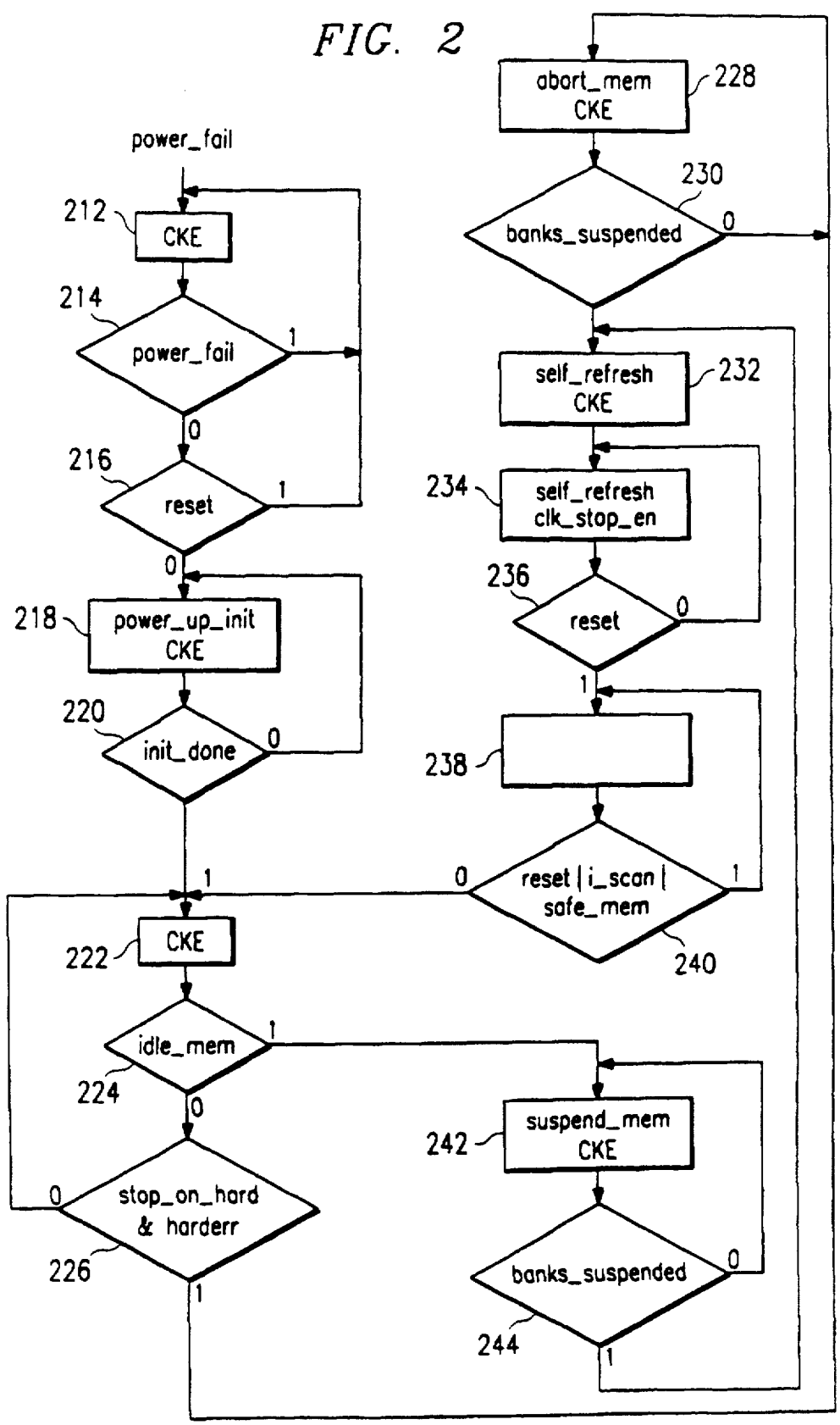

METHOD FOR REFRESHING A MEMORY, CONTROLLED BY A MEMORY CONTROLLER IN A COMPUTER SYSTEM, IN A SELF-REFRESH MODE WHILE SCANNING THE MEMORY CONTROLLER

TECHNICAL FIELD OF THE INVENTION

This invention pertains in general to computer architecture and in particular to a method and system of refreshing main memory.

BACKGROUND OF THE INVENTION

Modern computers have facilities for determining the state of the computer system. Such facilities are useful for testing the computer and for determining why a computing error occurred.

One way of testing a computer is "scan testing." In scan testing, the internal clocks of the computer are stopped and started in order to step through one or more cycles. Placing the computer in scan mode causes certain internal and external registers in the computer to interconnect into one or more continuous rings. Thus, the output of one register's bits are input into the next register in the ring. Such interconnections effectively turn the registers into a single large shift register. In the typical case, data from thousands or tens of thousands of registers can be shifted out in this manner. Software programs are then used to interpret the data and determine the state of the computer hardware.

When a system error occurs, it is also desirable to examine the contents of the computer's main memory. Since examining main memory might alter the state of the registers, however, main memory must be examined after the registers are scanned. Therefore, the contents of main memory must be preserved during the scan operation.

Unfortunately, it is difficult to preserve the state of memory while scanning. Modern computers use synchronous dynamic random access memory (SDRAM). In normal operation, a memory controller issues periodic refresh commands to the SDRAM. The SDRAM maintains an internal address counter and refreshes the proper addresses in response to the refresh command.

Since one of the first steps in scan testing is stopping the computer's internal clocks, the memory controller cannot send periodic refresh commands while scanning takes place. One prior art way to overcome this difficulty was to optionally remove the memory controller from the scan ring. When the memory controller was so removed, free running clocks in the memory controller allowed it to generate refreshes during the scan. When desired, an option bit could be set to return the memory controller to the scan ring.

A major problem with the above method of refreshing memory is that at least part of the memory controller is not scannable. Accordingly, if an error occurs in the memory controller, then there is no way to detect it. An additional problem with the above method is that it requires significant clock resources in the controller chip. The physical resources required on the chip to distribute clocks consume a sizable quantity of the chip area. Accordingly, there is little room on the chip for additional clocks.

Another way that prior art computers sent refresh commands to the SDRAM while scanning was to incorporate a refresh mechanism into the scan utilities. Accordingly, the part of the computer that controlled the scan also knew how to issue memory refreshes. However, this method required additional complexity in the scan utilities and the memory controller.

Therefore, there is a need in the art for a way to maintain the contents of SDRAM during scan and test operations.

More particularly, there is a need in the art for a way to maintain the SDRAM while leaving the memory controller fully scannable.

In addition, there is a need in the art for a way to maintain the SDRAM that does not require additional clock distribution logic on the memory controller chip.

SUMMARY OF THE INVENTION

The above and other needs are met by a method and system that places the SDRAM in auto-refresh mode during normal operations and self-refresh mode during scanning or testing operations. In auto-refresh mode, the SDRAMs refresh one internal row each time the SDRAMs receive a refresh command from the memory controller. While the computer is in regular use, the SDRAM remains in auto-refresh mode.

During scan or error conditions, the memory controller puts the SDRAM into self-refresh mode. To enter self-refresh mode, the SDRAM must be in the idle state. To guarantee this state, the memory controller watches for events requiring a transition to self-refresh mode. When such an event occurs, the memory controller ends any active memory operations and places the SDRAM in self-refresh mode before the clocks are stopped. When normal operation resumes, the SDRAM is taken out of self-refresh mode, auto-refresh is reinitialized, and the normal refresh cycle continues.

The only cost in the memory controller is the logic necessary to recognize the conditions under which self-refresh is used and to force the SDRAM into and out of self-refresh mode with a clock enable signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a diagram of an algorithmic state machine implementing the present invention.

DESCRIPTION OF THE PREFERRED EMBODIMENTS

Figure 1:
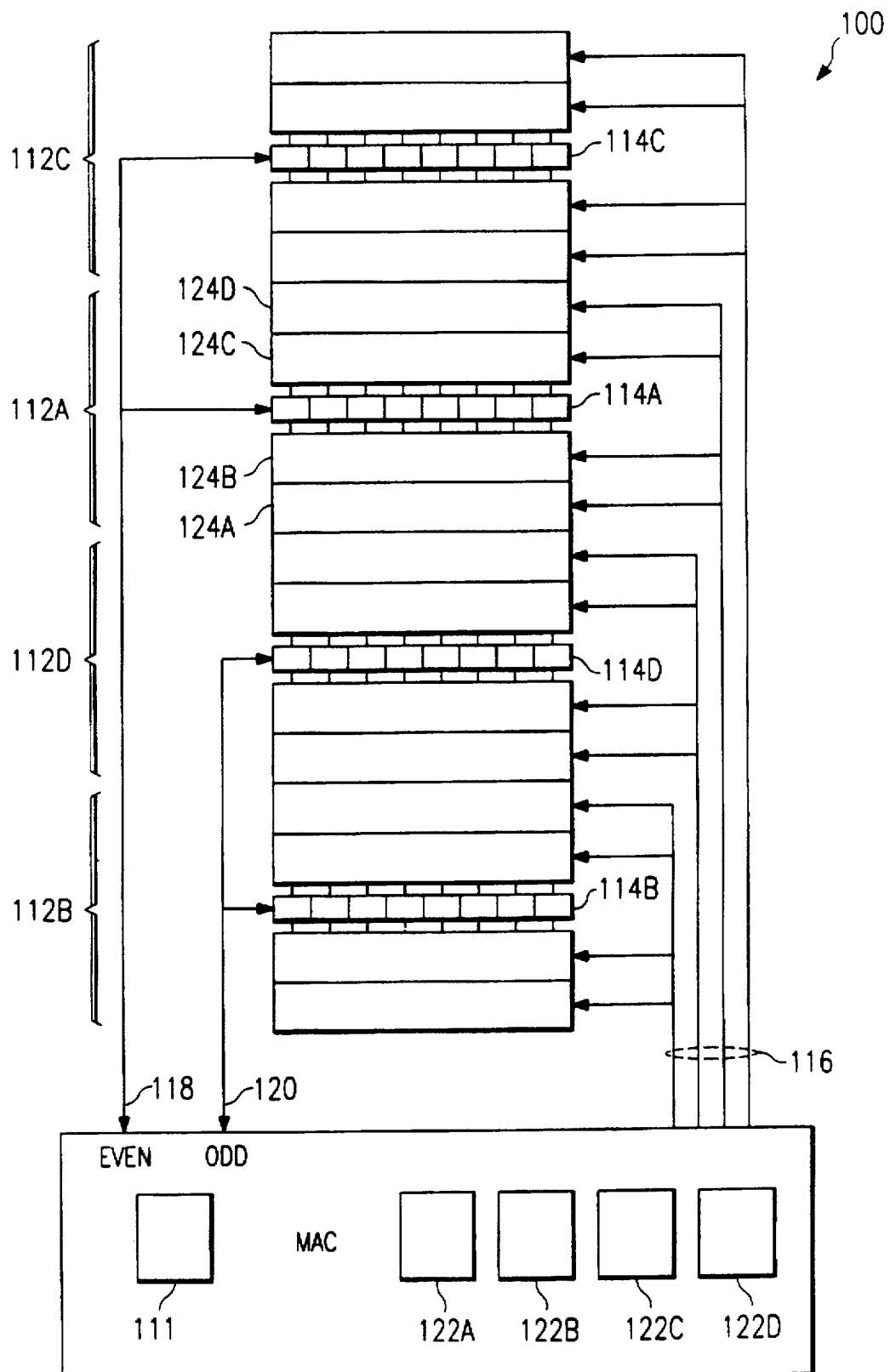
FIG. 1 is a high-level block diagram of a memory subsystem according to the present invention.

FIG. 1 is a high-level view of memory subsystem 100. Shown are memory access controller (MAC) 110 and four banks 112a–d of synchronous dynamic random access memory (SDRAM). In addition, a data register 114a–d is located in the middle of each memory bank 112. Address and control signals from MAC 110 to each memory bank 112a–d compose address bus 116. Data is transferred between registers 114 and MAC 110 via data buses 118, 120. Memory subsystem 100 is one of eight memory boards in a multi-processor computer system.

MAC 110 is a large application specific integrated circuit (ASIC). Among other things, MAC 110 controls all of the memory 112 in memory subsystem 100. Internally, MAC 110 is split into even 122a–b and odd 122c–d bank controllers which, respectively, control even 112a,112c and odd 112b,112d SDRAM banks. Within each bank controller 122a–d is a state machine for its corresponding SDRAM bank. MAC 110 also contains refresh mode controller 111, which is discussed in more detail with respect to FIG. 2.

As is well known in the art, SDRAM 112 is essentially dynamic random access memory (DRAM) with added state machines and registers in the control, address, and data paths. These state machines and registers simplify the memory interface and allow the external interface to be accelerated. In addition, SDRAM 112 has internal pipelining of the row and column addresses and the data paths that lets the SDRAM 112 efficiently utilize MAC 110. For example, MAC 110 could issue a read command in a first clock cycle. The SDRAM 112 will hold the command internally, and then execute the command. In the meantime, MAC 110 can issue other commands to different memory in subsequent clock cycles.

Each bank of SDRAM 112a–d of which bank 112a is exemplary, contains four dual in-line memory modules (DIMMs) 124a–d. Of course, single in-line memory modules (SIMMs) could readily be substituted. As mentioned above, the banks are organized into even and odd halves. As shown in FIG. 1, banks 112a and 112c are the even half while banks 112b and 112d are the odd half. Each memory register 114a–d stores outputs from its respective SDRAM bank 112a–d.

Address and control bus 116 transfer commands from MAC 110 to the SDRAM banks 112a–d. As with plain DRAMs, address and control bus 116 is divided into address lines, a column address strobe (CAS), a row address strobe (RAS), a write enable (WE), and a chip select. Unlike normal DRAMS, SDRAMS 112 also receive a clock enable (CKE) signal and clocks via bus 116. Since memory banks 112 are SDRAM, the control signals are used to encode memory commands. Thus, SDRAMs 112 receive commands such as activate, read, write, precharge, refresh, and "enter self-refresh" via the control signals. Data buses 118 and 120 transmit, respectively, from the even and odd bank registers 114 to MAC 110.

As mentioned above, SDRAM 112 works by capturing commands on a clock edge. Then, SDRAM 112 processes the commands internally to perform the desired function. Additionally, certain instructions can place the SDRAM in various modes that affect how SDRAM 112 behaves. Accordingly, SDRAM 112 has an internal state determined by its current mode and the instructions it has received.

Upon power up and in normal operation, SDRAM 112 is in "auto-refresh," or "directed-refresh," mode. In this mode, SDRAM 112 maintains an internal counter that tracks the next row address to be refreshed. Upon receipt of a "refresh" command from MAC 110, SDRAM 112 refreshes the address indicated by the counter and increments the counter. If MAC 110 does not send a refresh command within the refresh interval, the data at that address may be lost.

If SDRAM 112 is in an idle state, then MAC 110 can switch SDRAM 112 into "self-refresh" mode. This switch is performed by simultaneously issuing an "enter self-refresh" command and negating the CKE signal. While in this mode, SDRAM 112 will automatically refresh itself using the same address counter and an internal clock source. SDRAM 112 will not respond to read or write commands while in self-refresh mode.

Note that self-refresh mode was originally intended to maintain memory while the computer containing the memory was in a power saving mode. In personal computers (PCs) and workstations where SDRAM is typically used, there is usually no need to maintain the state of the SDRAM through an error. If an error occurs, the computers or workstations are rebooted.

However, a preferred embodiment of the present invention resides in large scale multiprocessor servers for technical and commercial applications. In such computers, service requirements dictate that the system state be captured so that the state can be used to diagnose and debug failures. Using self-refresh mode to maintain memory during scanning and testing saves resources because self-refresh mode does not require a separate controller or require a separate clock tree to issue refresh requests to the SDRAM.

Therefore, once SDRAM 112 is in self-refresh mode, scanning and testing of MAC 110 can begin. In general, scanning is accomplished by using a multiplexer to link the inputs and outputs of each register in MAC 110 to form a ring. Then, the values in the registers are shifted out through the ring for later analysis.

In scan mode, unpredictable values may be shifted through the registers as the scan progresses. Therefore, any output of MAC 110 that is directly dependent on the value of a register becomes unpredictable while scanning. As a result, registers that are driving outputs that must be stable are removed from the main scan ring. Instead, such registers are placed in separate sub-rings. These sub-rings can be tested in the same manner as the main ring by placing the logic in one or more special test modes.

FIG. 2 is a diagram of an algorithmic state machine illustrating how refresh mode controller (RMC) 111 switches SDRAM 112 between the auto- and self-refresh modes. In FIG. 2, each box indicates a state and the text within each box indicates a signal that is asserted in that state. Unless otherwise indicated, all of the signals except CKE are internal to MAC 110.

Each diamond in FIG. 2 represents a test and the text within each diamond represents the signals that are being tested at that point. Within the diamonds, a "|" symbol represents a Boolean OR while an "&" symbol indicates a Boolean AND. The exit points of the diamonds are labelled "0" or "1" and indicate the path to follow depending upon the evaluation of the Boolean expression within the diamond.

When system power is applied, an external signal, power_fail, is asserted to MAC 110 until power stabilizes. Immediately thereafter, CKE is asserted (state 212) as required for SDRAM initialization. As shown by test 214, RMC 111 remains in state 212 until power_fail is negated. At test 216, RMC 111 checks to see whether it is being held in a reset condition. RMC 111 remains in state 212 until both power_fail and reset are no longer asserted.

Next, at state 218, RMC 111 also asserts the power_up_init signal. This signal is given to each of the bank controllers 122 in MAC 110. In response, the bank controllers 122 execute the SDRAM power up initialization sequence. As shown by test 220, the state machines return an init_done signal when initialization is finished.

Once initialization has completed, RMC 111 begins normal operation. Normal operation is shown by state 222, in which only CKE is asserted. At this state 222, MAC 110 issues read, write, and auto-refresh commands to the memory as necessary.

There are two signals, idle_mem and harderr, which indicate that memory subsystem 100 should shut down in an orderly fashion. Test 224 checks whether a scan controller has asserted idle_mem. Signal idle_mem orders memory subsystem 100 into an idle state so that scan operations can be performed.

If idle_mem is asserted, RMC 111 moves to state 242. At state 242, RMC 111 asserts suspend_mem in addition to CKE. These signals tell the bank state machines within the controllers 122 to suspend memory after the current operations are complete (but not to abort current operations). When each bank controller 112a–d suspends operation, it sends back a bank_suspended signal to MAC 110. As shown by test 244, when bank_suspended is true for each bank, RMC 111 moves to state 232.

Returning to test 224, if idle_mem is not asserted, then test 226 determines whether harderr is asserted. Signal harderr is asserted when the computer system has detected an internal processing error. Normally, a computer operator will wish to scan the computer system once an error is detected. However, sometimes an operator will wish to allow the computer system to continue processing. Therefore, a preferred embodiment of memory subsystem 100 has the option of not stopping operations on a hard error. This option is indicated by the signal stop_on_hard in test 226. If stop_on_hard is not asserted, then RMC 111 returns to state 222.

If both harderr and stop_on_hard are asserted, then RMC 111 moves to state 228. At state 228, RMC 111 issues the abort_mem signal to the bank state machines. This signal instructs each state machine to force its respective SDRAM 112 into self-refresh mode as quickly as possible without regard for maintaining any currently-executing memory operations. When all of the bank state machines have suspended operations and asserted bank_suspended (test 230), RMC 111 moves to state 232.

In state 232, RMC 111 asserts a self_refresh signal. This signal tells bank controllers 122 to generate "enter self-refresh" commands. In addition, CKE remains asserted. This signal combination tells bank controllers 122 to override whatever signals were contained in the SDRAM control signal output registers and force the register outputs to signal the SDRAM self-refresh command. On the next clock cycle, the SDRAM self-refresh command is held, but the CKE signal is negated, which forces the SDRAMs into self-refresh mode and advances RMC 111 to state 234.

At state 234, the state machine asserts a clk_stop_en (clock stop enable) signal. The portion of MAC 110 responsible for clocks and scan test operations receives this signal and allows testing and scanning operations to begin. While testing and scanning occurs, clocks may start and stop without affecting the SDRAMs 112.

As shown by test 236, memory system 100 will stay in state 234 until a reset signal is asserted. Once reset is asserted, RMC 111 moves to state 238 and releases clk_stop_en and self_refresh. Note, however, that CKE is not asserted and, therefore, SDRAMs 112 remain in self-refresh mode.

At state 238, RMC 111 waits for the reset signal to negate and for scan mode to end. Test 240 checks for the end of scan mode, which is indicated when signal i_scan is negated In addition, test 240 checks whether the safe_mem signal has been negated. Safe_mem is an options ring bit that is set to force memory subsystem 100 to be held in self-refresh mode regardless of whatever else is done. Use of safe_mem is necessary because multiple scan operations may be desired. Without safe_mem, the SDRAMs might leave self-refresh mode during the gap between the scans. In such a case, memory loss would occur because memory subsystem 100 would not yet be ready for auto-refresh mode.

As shown by test 240, when reset, i_scan, and safe_mem are all negated, RMC 111 returns to state 222. At state 222, CKE is asserted and SDRAM 112 returns to normal, auto-refresh, mode.

Although the present invention and its advantages have been described in detail, it should be understood that various changes, substitutions and alterations can be made herein without departing from the spirit and scope of the invention as defined by the appended claims.

What is claimed is:

1. A memory subsystem, comprising:
   at least one memory bank; and
   a memory controller for controlling the at least one memory bank, the memory controller comprising:
   means for receiving a signal requesting that access to the at least one memory bank be suspended;
   means for suspending access to the at least one memory bank in response to the received signal;
   means for commanding the at least one memory bank to enter a self-refresh mode once memory access has been suspended;
   means for scanning the memory controller while the at least one memory bank is in self-refresh mode; and
   means for commanding the at least one memory bank to exit from the self-refresh mode when scanning is finished.

2. The memory subsystem of claim 1, wherein the means for scanning comprises:
   means for linking registers within the memory controller into at least one chain.

3. The memory subsystem of claim 1, wherein the means for receiving a signal comprises:
   means for receiving a first signal requesting that the at least one memory bank be idled; and
   means for receiving a second signal indicating that an error has occurred.

4. The memory subsystem of claim 3, wherein the means for suspending access comprises:
   means for aborting access to the at least one memory bank if the second signal is received.

5. The memory subsystem of claim 1, wherein the means for commanding the at least one memory bank to exit the self-refresh mode comprises:
   means for detecting when scanning of the memory subsystem is complete.

6. The memory subsystem of claim 1, wherein the at least one memory bank is comprised of SDRAM.

7. A method of scanning a memory controller controlling a memory, the memory controller and the memory are in a computer system, the method comprising the steps of:
   asserting a signal indicating that scanning is required;
   in response to the signal, placing the memory in self-refresh mode and scanning the memory controller; and
   when said scanning is complete, removing the memory from the self-refresh mode.

8. The method of claim 7, wherein the signal requests that the memory be idled.

9. The method of claim 7, wherein the signal indicates a computer system error.

10. The method of claim 9, further comprising the step of:
   determining whether to stop the computer system if the signal indicates the computer system error.

11. The method of claim 7, wherein the memory is SDRAM.

12. The method of claim 7, wherein the placing step comprises the steps of:
   suspending the memory;
   sending a self-refresh command to the memory; and
   negating a clock enable signal.

13. The method of claim 7, wherein the removing step comprises the steps of:
   determining whether scanning is complete; and
   if scanning is complete, asserting a clock enable signal.

14. The method of claim 13, wherein the removing step further comprises the step of:
   placing the memory in auto-refresh mode.

15. A method of examining a computer system having a memory controlled by a memory controller, the method comprising the step of:
   placing the memory in a self-refresh mode;
   scanning the memory controller while the memory is in the self-refresh mode; and
   when said scanning is complete, removing the memory from the self-refresh mode.

16. The method of claim 15, wherein the memory is SDRAM.

17. The method of claim 15, wherein the placing step comprises the steps of:
   receiving a first signal;
   in response to the first signal, issuing a second signal to a bank controller of the memory controller requesting that the memory suspend access;
   receiving a third signal from the bank controller indicating that the memory has suspended access; and
   in response to the third signal, issuing a fourth signal commanding the memory to enter the self-refresh mode.

18. The method of claim 17, wherein the first signal requests that the memory be idled.

19. The method of claim 17, wherein the first signal indicates that an error has occurred and wherein the second signal is sent to the memory and requests that the memory abort access.

20. The method of claim 15, wherein the removing step comprises the step of:
   placing the memory in an auto-refresh mode.

* * * * *